United States Patent
Bousquet et al.

(10) Patent No.: US 7,504,321 B2
(45) Date of Patent: Mar. 17, 2009

(54) MBE GROWTH OF AN ALGAN LAYER OR ALGAN MULTILAYER STRUCTURE

(75) Inventors: Valerie Bousquet, Oxford (GB); Stewart Edward Hooper, Oxfordshire (GB); Jennifer Mary Barnes, Oxford (GB); Katherine L. Johnson, Oxford (GB); Jonathan Heffernan, Oxford (GB)

(73) Assignee: Sharp Kabushiki Kaisha, Osaki-shi (JP)

( * ) Notice: Subject to any disclaimer, the term of this patent is extended or adjusted under 35 U.S.C. 154(b) by 460 days.

(21) Appl. No.: 10/525,406

(22) PCT Filed: Aug. 18, 2003

(86) PCT No.: PCT/JP03/10421

§ 371 (c)(1), (2), (4) Date: May 5, 2006

(87) PCT Pub. No.: WO2004/019390

PCT Pub. Date: Mar. 4, 2004

(65) Prior Publication Data

US 2006/0237740 A1 Oct. 26, 2006

(30) Foreign Application Priority Data

Aug. 23, 2002 (GB) ................. 0219728.3

(51) Int. Cl.
*H01L 21/00* (2006.01)
(52) U.S. Cl. .......... 438/478; 438/479; 438/483
(58) Field of Classification Search ......... 438/478–479, 438/483
See application file for complete search history.

(56) References Cited

U.S. PATENT DOCUMENTS

| 6,579,780 | B2 * | 6/2003 | Takahashi | ........ 438/479 |
| 6,580,101 | B2 * | 6/2003 | Yoshida | ........ 257/192 |
| 6,768,146 | B2 * | 7/2004 | Yoshida | ........ 257/279 |
| 7,427,555 | B2 * | 9/2008 | Haskell et al. | ........ 438/478 |
| 2001/0006840 | A1 * | 7/2001 | Takahashi | ........ 438/483 |
| 2001/0032999 | A1 * | 10/2001 | Yoshida | ........ 257/332 |
| 2003/0098462 | A1 * | 5/2003 | Yoshida | ........ 257/183 |

(Continued)

FOREIGN PATENT DOCUMENTS

EP  1 061 564 A2  12/2000

(Continued)

*Primary Examiner*—Laura M Menz
(74) *Attorney, Agent, or Firm*—Harness Dickey & Pierce

(57) ABSTRACT

A method of growing an AlGaN semiconductor layer structure by Molecular Beam Epitaxy comprises supplying ammonia, gallium and aluminum to a growth chamber thereby to grow a first (Al,Ga)N layer by MBE over a substrate disposed in the growth chamber. The first (Al,Ga)N layer has a non-zero aluminum mole fraction. Ammonia is supplied at a beam equivalent pressure of at least $1\ 10^{-4}$ mbar, gallium is supplied at a beam equivalent pressure of at least $1\ 10^{-8}$ mbar and aluminum is supplied at a beam equivalent pressure of at least $1\ 10^{-8}$ mbar during the growth step. Once the first (Al,Ga)N layer has been grown, varying the supply rate of gallium and/or aluminum enables a second (Al,Ga)N layer, having a different aluminum mole fraction from the first (Al,Ga)N layer to be grown by MBE over the first (Al,Ga)N layer. This process may be repeated to grown an (Al,Ga)N multilayer structure.

21 Claims, 4 Drawing Sheets

U.S. PATENT DOCUMENTS

2006/0121637 A1* 6/2006 Hooper et al. ................ 438/31
2006/0128122 A1* 6/2006 Bousquet et al. ............ 438/478
2006/0237740 A1* 10/2006 Bousquet et al. ............ 257/103

FOREIGN PATENT DOCUMENTS

| EP | 1 164 210 A2 | 12/2001 |
|---|---|---|
| GB | 2392169 A * | 2/2004 |
| WO | WO 02/01608 A2 | 1/2002 |
| WO | WO 02/103090 A2 | 12/2002 |

* cited by examiner

MBE GROWTH OF AN ALGAN LAYER OR ALGAN MULTILAYER STRUCTURE

TECHNICAL FIELD

This invention relates to a molecular beam epitaxy (MBE) method for the epitaxial growth of an AlGaN layer. The invention may be applied to the epitaxial growth of a semiconductor layer structure, for example a quantum well or multiple quantum well structure, comprising one or more $Al_xGa_{1-x}N$ ($0 \leq x \leq 1$) layers. The layer structure may be incorporated in a semiconductor light-emitting device.

BACKGROUND ART

The term "AlGaN" is used to denote a member of the $Al_xGa_{1-x}N$ ($0 \leq x \leq 1$) material family having an aluminium mole fraction x that is non-zero but is less than 1. The complete material family, including x=0 and x=1, will be referred to herein as "(Al,Ga)N" for convenience.

Similarly, the term "InGaN" is used to denote a member of the $In_yGa_{1-y}N$ ($0 \leq y \leq 1$) material family having an aluminium mole fraction y that is non-zero but is less than 1. The complete material family, including y=0 and y=1, will be referred to herein as "(In,Ga)N" for convenience.

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD/VPE takes place in an apparatus which is commonly at atmospheric pressure but sometimes at a slightly reduced pressure of typically about 10 kPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

In contrast to CVD/VPE, MBE is carried out in a high vacuum environment. In the case of MBE as applied to the (Al,Ga)N system, an ultra-high vacuum (UHV) environment, typically around $1 \times 10^{-3}$ Pa, is used. A nitrogen precursor is supplied to the MBE chamber by means of a supply conduit and species providing gallium and/or aluminium, and if desired also a suitable dopant species, are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The nitrogen precursor and the species supplied from the effusion cells travel across the MBE chamber and reach the substrate where epitaxial growth takes place in a manner which is driven by the deposition kinetics.

At present, the majority of growth of high quality nitride semiconductor layers is carried out using the metal-organic vapour phase epitaxy (MOVPE) process. The MOVPE process allows growth to occur at a V/III ratio well in excess of 1000:1. The V/III ratio is the molar ratio of the group V element to the Group III element during the growth process. A high V/III ratio is preferable, since this allows a higher substrate temperature to be used which in turn leads to a higher quality semiconductor layer.

At present, growing high quality nitride semiconductor layers by MBE is more difficult than growing such layers by MOVPE. The principal difficulty is in supplying sufficient nitrogen during the growth process, and it is difficult to obtain a V/III ratio of 10:1 or greater during MBE growth of a nitride semiconductor layer. The two commonly used sources of nitrogen in the MBE growth of nitride layers are plasma excited molecular nitrogen or ammonia.

Many electronic or optoelectronic devices such as, for example, light-emitting devices such as light-emitting diodes (LEDs) or laser diodes incorporate (Al,Ga)N layers or (Al,Ga)N layer structures (heterostructures). The growth of (Al,Ga)N layers is therefore of considerable commercial importance.

ACKNOWLEDGEMENT OF PRIOR ART

There are reports on the growth of AlGaN layers and AlGaN heterostructures by metalorganic VPE, including S. Nakamura in "The Blue Laser Diode", published by Springer. AlGaN layers and layer structures grown by MOVPE have been incorporated in LEDs and in laser diodes.

M. J. Murphy et al. have reported, in "MRS Internet J. Nitride Semicond. Research", 4S1, G8.4 (1999) the growth of an AlGaN layer by molecular beam epitaxy. This prior technique gives promising results for electronic devices such as field-effect transistors, but it does not relate to the growth of AlGaN layer structures.

N. Grandjean and J. Massies, in "Appl. Phys. Lett." Vol. 71, p 1816 (1997), and N. Grandjean et al, in "Semic. Sci. & Techn." Vol. 16, p 358 (2001), have reported the growth of AlGaN layers by MBE using ammonia as the nitrogen precursor. These reports use a growth temperature of approximately 800° C. and a V/III ratio of between 3 and 5. The V/III ratio obtained in these reports is much lower than the V/III ratios obtainable by MOCVD growth.

K. Nozawa et al. report, in "J. Cryst. Growth" Vol. 189, p 114 (1998), the growth of an AlGaN/GaN superlattice by MBE using an RF-plasma cell as the source of nitrogen. The growth is performed at the relatively low temperature of 760° C.

J. W. Kim et al. report, in "J. Cryst. Growth", Vol. 208, p 37 (2000), the growth of an AlGaN epilayer on a sapphire substrate by plasma-induced MBE. This growth method is performed at a temperature of around 800°. Since this method uses a nitrogen plasma as the nitrogen precursor, rather than ammonia, it has a relatively low V/III ratio.

There are many other reports of MBE growth of semiconductor layers. For example, GB-A-2 363 518 discloses a method of growing a GaN layer by MBE, GB-A-2 350 842 discloses a method of MBE growth of carbon-doped GaN, GB-A-2 331 307 discloses a method of MBE growth of a GaN buffer layer, EP-A-1 061 564 discloses a method of MBE growth of a GaN or AlGaN buffer layer, EP-A-0 607 435 discloses a method of MBE growth of an GaAlN layer structure, and JP-A-59 57 997 discloses growth of a GaN layer over an AlN layer. However, none of these documents addresses growth of AlGaN.

JP-A-61 18 184 discloses MBE growth of an AlGaN single crystal film, but gives no details about the growth conditions used.

GB-A-2 372 632 and EP-A-1 235 256 disclose a method of growing an InGaN layer by MBE. However, these documents do not specifically address growth of AlGaN. Furthermore, these documents were not published until after the priority date of this application.

DISCLOSURE OF THE INVENTION

The present invention provides a method of growing an AlGaN semiconductor layer structure, the method comprising the step of: (a) supplying ammonia, gallium and aluminium to a growth chamber thereby to grow a first (Al,Ga)N layer having a non-zero aluminium mole fraction by MBE over a substrate disposed in the growth chamber; wherein ammonia is supplied at a beam equivalent pressure (that is, b.e.p.) of at least $1 \times 10^{-4}$ mbar, gallium is supplied at a beam equivalent pressure of at least $1 \times 10^{-8}$ mbar and aluminium is supplied at a beam equivalent pressure of at least $1 \times 10^{-8}$ mbar.

Ammonia may be supplied at a beam equivalent pressure in the range from $1 \times 10^{-4}$ mbar to $2 \times 10^{-2}$ mbar.

The substrate temperature may be within the range from 850° C. to 1050° C.

Gallium maybe supplied at a beam equivalent pressure in the range from $1 \times 10^{-8}$ mbar to $1 \times 10^{-4}$ mbar. Aluminium may be supplied at a beam equivalent pressure in the range from $1 \times 10^{-8}$ mbar to $1 \times 10^{-4}$ mbar, and more preferably at a beam equivalent pressure in the range from $1 \times 10^{-8}$ mbar to $2 \times 10^{-7}$ mbar.

The method may comprise the further step of: (b) varying the supply rate of gallium and/or aluminium thereby to grow a second (Al,Ga)N layer by MBE over the first (Al,Ga)N layer, the second (Al,Ga)N layer having a different aluminium mole fraction from the first (Al,Ga)N layer.

Step (b) may comprise reducing the supply rate of aluminium to zero whereby the second (Al,Ga)N layer is a GaN layer.

The method may comprise the further step of: (c) varying the supply rate of gallium and/or aluminium thereby to grow a third (Al,Ga)N layer by MBE over the second (Al,Ga)N layer, the third (Al,Ga)N layer having a different aluminium mole fraction from the second (Al,Ga)N layer.

The third (Al,Ga)N layer may have substantially the same aluminium mole fraction as the first (Al,Ga)N layer.

The substrate may comprise an (In,Ga)N layer. It may be an InGaN substrate, or it may be a GaN substrate. It may comprise an (In,Ga)N epitaxial layer disposed over a base substrate.

The method may comprise the further step of supplying a dopant during at least one of step (a), step (b) or step (c).

The first (Al,Ga)N layer may have an aluminium mole fraction of greater than 0.01. It may have an aluminium mole fraction of less than 0.2.

A second aspect of the invention provides an (Al,Ga)N layer grown by a method as defined above.

A third aspect of the invention provides an (Al,Ga)N multilayer structure grown by a method defined above.

A fourth aspect of the invention provides an optoelectronic device comprising an (Al,Ga)N layer as defined above.

A fifth aspect of the invention provides an optoelectronic device comprising an (Al,Ga)N multilayer structure as defined above.

BRIEF DESCRIPTION OF THE DRAWINGS

Preferred embodiments of the present invention will now be described by way of an illustrative example with reference to the accompanying figures in which.

BEST MODE FOR CARRYING OUT THE INVENTION

Figure 1:
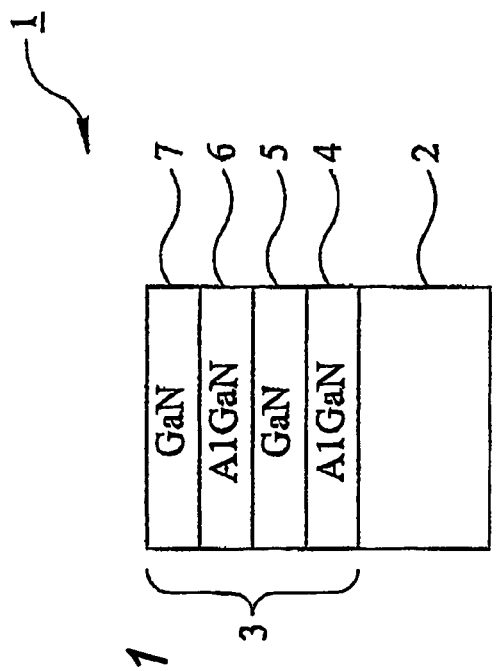
FIG. 1 is a schematic sectional view of a semiconductor structure incorporating an (Al,Ga)N multilayer structure.

FIG. 1 is a schematic illustration of a semiconductor structure 1. Such a structure may be used in an optoelectronic device such as a light-emitting device, for example a light-emitting diode ("LED") or a laser diode. The structure 1 has a substrate 2. The substrate may be a bulk substrate of Ga or InGaN. The substrate may alternately consist of an epitaxial layer of GaN or InGaN disposed on a base substrate of, for example, sapphire, SiC, Si, ZnO, MgO or GaN.

The semiconductor structure 1 of FIG. 1 further comprises a semiconductor multilayer structure 3. The multilayer structure 3 consists of a plurality of (Al,Ga)N layers having at least two different aluminium mole fractions. Four (Al,Ga)N layers are shown in FIG. 1, but a multilayer structure may consist of fewer or more than four (Al,Ga)N layers. In the structure shown in FIG. 1 the first (Al,Ga)N layer 4 of the multilayer structure 3 is an AlGaN layer (that is, it has a non-zero aluminium mole fraction). The second (Al,Ga)N layer 5 has an aluminium mole fraction of zero and so is a GaN layer. The third (Al,Ga)N layer 6 is a further AlGaN layer, preferably with the same aluminium mole fraction as the first (Al,Ga)N layer 4. Finally, the fourth (Al,Ga)N layer 7 is a further GaN layer. The multilayer structure 3 thus contains quantum wells and is alternatively known as a multiple quantum well structure.

A practical device may well contain other layers such as, for example, a capping layer and contact layers, but these have been omitted from the structure shown in FIG. 1 for clarity. These other layers may be provided on the lower face of the substrate 2, between the substrate 2 and the multilayer structure 3, or over the multilayer structure 3.

The multilayer structure of the semiconductor structure 1 shown in FIG. 1 consists of alternating AlGaN layers and GaN layers, and so is referred to as an "AlGaN/GaN multilayer structure". The multilayer structure may alternatively consist of AlGaN layers having a non-zero aluminium mole fraction alternating with AlGaN layers having a different, but also non-zero, aluminium mole fraction, and this would be referred to simply as an "AlGaN multilayer structure".

Selected ones of the (Al,Ga)N layers 4-7 may be doped using a suitable impurity so as to display extrinsic conductivity. One example of a suitable n-type dopant is Si, and one example of a suitable p-type dopant is Mg, although other dopants may be used.

Figure 2:
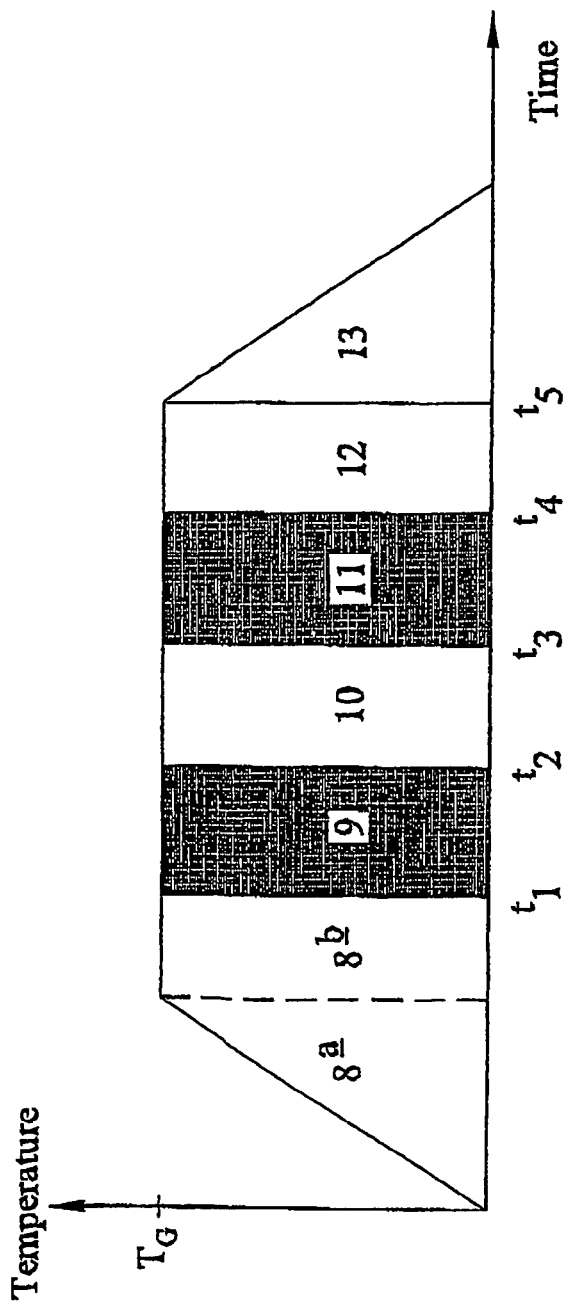
FIG. 2 illustrates the relation between substrate temperature and time for a growth method of the present invention.

FIG. 2 illustrates a growth method of the present invention as applied to the growth of a semiconductor layer structure, in this example to the growth of a device having the general structure shown in FIG. 1. The invention provides a MBE growth method that uses ammonia as the source of nitrogen for the growth process.

According to the present invention, the (Al,Ga)N layers 4-7 are grown over the substrate by MBE using ammonia as a nitrogen precursor. Growth of the first (Al,Ga)N layer 4 is step 9 in FIG. 2. The supply rate of gallium and the supply rate of aluminium for step 9 are chosen so that the first (Al,Ga)N layer 4 has a desired aluminium mole fraction. In many layer structures, the desired aluminium mole fraction of the first (Al,Ga)N layer 4 is greater than 0.01 and/or less than 0.2.

Once the first (Al,Ga)N layer 4 has been grown, the supply rate of gallium and/or the supply rate of aluminium is/are then changed, to enable the second (Al,Ga)N layer 5 to be grown with a different aluminium mole fraction to the first (Al,Ga)N mole fraction. For example, if the second (Al,Ga)N layer 5 is intended to be a GaN layer, the supply of aluminium would be stopped once the first (Al,Ga)N layer 4 had been grown to its desired thickness. Growth of the second (Al,Ga)N layer 5 is step 10 in FIG. 2.

Once the second (Al,Ga)N layer 5 has been grown to its desired thickness, the supply rate of gallium and/or the supply rate of aluminium is/are then changed, to enable the third (Al,Ga)N layer 6 to be grown with the same aluminium mole fraction as the first (Al,Ga)N layer 4. Growth of the third (Al,Ga)N layer 6 is step 11 in FIG. 2. Similarly, once the third (Al,Ga)N layer 6 has been grown to its desired thickness, the supply rate of gallium and/or the supply rate of aluminium is/are then changed, to enable the fourth (Al,Ga)N layer 7 to be grown with the same aluminium mole fraction as the second (Al,Ga)N layer 5. Growth of the fourth (Al,Ga)N layer 7 is step 12 in FIG. 2.

The supply of ammonia to the growth chamber is maintained continuously during steps 9 to 12. The flow rate of ammonia is preferably maintained substantially constant, and is preferably not intentionally varied between successive steps or within a step.

A full description of the growth method of FIG. 2 will now be given.

Initially, a suitable substrate 2 is prepared and cleaned in any conventional manner, and is then introduced into the growth chamber of a suitable MBE apparatus. As mentioned above, the substrate 2 may contain an (In,Ga)N layer. For example, it may be a bulk substrate of GaN or InGaN, or it may consist of an epitaxial layer of GaN or InGaN disposed on a base substrate of, for example, sapphire, SiC, Si, ZnO, MgO or GaN.

In step 8a the substrate is heated to a pre-determined growth temperature $T_G$. According to the present invention, this substrate temperature is preferably greater than 850° C. and is also preferably less than 1050° C.

GaN tends to decompose when it is heated to a temperature of around 800° C. or higher. This decomposition may be prevented by supplying an over-pressure of nitrogen gas or ammonia gas to the surface of the GaN. If the substrate 2 is a GaN substrate, or an epitaxial layer of GaN disposed on a base substrate, it is therefore preferable to supply ammonia gas to the growth chamber during step 8a of heating the substrate to the temperature desired, in order to prevent thermal decomposition of the substrate. Since the subsequent growth steps will be carried out using ammonia as the nitrogen precursor, it is preferable if ammonia gas, rather than nitrogen gas, is supplied to the growth chamber during step 8a. In principle, the ammonia gas does not need to be supplied at substrate temperatures substantially below 800° C., but it may be more convenient to supply ammonia gas for the entire duration of the heating step.

The rate at which the temperature of the substrate is increased to the desired growth temperature $T_G$ in step 8a should not be so great that an uneven temperature distribution might occur in the substrate, since this would set up thermal stresses in the substrate. A temperature ramp rate in the range of 10-120° C. per minute has been found to be suitable.

Once the substrate has reached the desired substrate temperature—which is the desired substrate temperature for the growth of the first (Al,Ga)N layer 4, the substrate is preferably maintained at this temperature for up to thirty minutes to bake the substrate and thereby remove contaminants from the substrate. This is step 8b of FIG. 2. The supply of ammonia gas to the growth chamber is maintained through step 8b—indeed, once started, the supply of ammonia gas to the growth chamber is maintained continuously throughout the growth of the layers of the device 1.

At the end of the baking step (or, if there is no baking step, once the temperature of the substrate 2 has reached the desired substrate temperature $T_G$) the supply of gallium to the growth chamber is then started. This occurs at time $t_1$ in FIG. 2. If the first (Al,Ga)N layer 4 is desired to have a non-zero aluminium mole fraction, the supply of aluminium to the growth chamber is also started at time $t_1$. Thus, gallium and nitrogen, and aluminium, are now being supplied to the growth chamber and, as a result, the first (Al,Ga)N layer 4 will now be grown by MBE on the substrate 2. Growth of the first (Al,Ga)N layer 4 is shown as step 9 in FIG. 2, and this step is maintained for the time required for the layer 4 to reach its desired thickness.

After a growth period corresponding to the time required for the first (Al,Ga)N layer 4 to grow to its desired thickness, the supply rate of gallium and/or the supply rate of aluminium is/are then changed to enable the second (Al,Ga)N layer 5 to be grown with a different aluminium mole fraction to the first (Al,Ga)N mole fraction. This occurs at time $t_2$ in FIG. 2. For example, if the second (Al,Ga)N layer 5 is desired to be a GaN layer, the supply of aluminium would be stopped at time $t_2$. Growth of the second (Al,Ga)N layer 5 is step 10 in FIG. 2. As noted above, the supply rate of ammonia is preferably not changed between successive growth steps, but is maintained at a constant rate throughout the entire growth process.

Similarly, after a growth period corresponding to the time required for the second (Al,Ga)N layer 5 to grow to its desired thickness, the supply rate of gallium and/or the supply rate of aluminium is/are then changed to enable the third (Al,Ga)N layer 6 to be grown. This occurs at time $t_3$ in FIG. 2. For example, if the third (Al,Ga)N layer 6 is desired to have the same (non-zero) aluminium mole fraction as the first (Al,Ga)N layer 4, the supply rates of gallium and aluminium selected at time $t_3$ would be the same as the supply rates of gallium and aluminium selected at time $t_1$. Growth of the third (Al,Ga)N layer 6 is step 11 in FIG. 2.

Similarly, after a growth period corresponding to the time required for the third (Al,Ga)N layer 6 to grow to its desired thickness, the supply rate of gallium and/or the supply rate of aluminium is/are again changed to enable the fourth (Al,Ga)N layer 7 to be grown. This occurs at time $t_4$ in FIG. 2. For example, if the fourth (Al,Ga)N layer 7 is desired to be a GaN layer, the supply of aluminium would be stopped at time $t_4$. Growth of the fourth (Al,Ga)N layer 7 is step 12 in FIG. 2.

The gallium flux is preferably held at a substantially constant value over the entire duration of the growth of the (Al,Ga)N layer structure 3, with the composition of the particular layer being grown being selected by varying the aluminium flux. In this embodiment, the aluminium flux may be simply varied between a pre-set value ("ON") and zero ("OFF") so that a sequence of alternating AlGaN and GaN layers is grown. Alternatively, the aluminium flux may be simply varied between a first non-zero value and a second, different non-zero value, so that a sequence of AlGaN layers of alternating low and high aluminium concentrations is grown.

As noted above in the description of FIG. 1, the multilayer structure 3 may contain more than four (Al,Ga)N layers. In this case, steps 11 and 12 are repeated as often as necessary to grow the desired layer structure.

In the embodiment of FIG. 2, the substrate temperature is preferably not intentionally varied during growth of the multilayer structure 3, so that the (Al,Ga)N layers 4-7 are grown at the same nominal substrate temperature $T_G$. Growing the (Al,Ga)N layers at the same nominal substrate temperature avoids the need to interrupt the growth process to heat or cool the substrate between growth of one (Al,Ga)N layer and growth of the next (Al,Ga)N layer.

After a growth period corresponding to the time required for the last (Al,Ga)N layer to grow to its desired thickness, the supply of gallium and, if the last (Al,Ga)N layer is an AlGaN layer, aluminium to the growth chamber is then shut off. This occurs at time $t_5$ in FIG. 2. The structure 1 shown in FIG. 1 is now complete.

Finally, in step 13, the substrate is cooled from the growth temperature $T_G$ to room temperature. As for the initial heating step, the rate of change of the substrate temperature should not be so great that an uneven temperature distribution might occur in the substrate. A temperature ramp rate in the range of 10-120° C. per minute should again be suitable.

The supply of ammonia to the growth chamber is preferably maintained until the substrate temperature is substantially below 800° C., to prevent thermal decomposition of the finally-grown (Al,Ga)N layer. The supply of ammonia to the growth chamber may be maintained for the entire duration of the cooling step 13 for convenience.

As noted above, a practical electronic or optoelectronic device may contain further layers. Where it is desired to grow further layers over the multilayer structure 3, these are grown after step 12 but before the cooling step 13 (if necessary, the substrate temperature is changed to a new value for the growth of these layers). If it is desired to grow one or more additional layers over the substrate 2 before growth of the multilayer structure 3, such layer(s) is/are grown after the baking step 8b (or after the heating step 8a if there is no baking step), but before step 9 of growing the first layer of the multilayer structure (if necessary, the substrate temperature is changed to a new value after the growth of the additional layers, before growth of the first (Al,Ga)N layer 4.)

Ammonia gas is supplied to the growth chamber continuously during steps 9 to 12. Furthermore, ammonia is preferably supplied during the initial heating stage 8a, the baking step 8b (if present) and the final cooling stage 13, except perhaps for substrate temperatures significantly below 800° C. The ratio of the ammonia to the elemental metal supplied to the growth chamber is preferably in the range 10:1 to 5,000:1. This high V/III ratio allows the GaN and AlGaN layers to be grown by MBE at temperatures well above those used in prior MBE growth methods, and this leads to improved material quality.

The beam equivalent pressure of ammonia gas is preferably at least $1 \times 10^{-4}$ mbar, and particularly preferably is in the range from $1 \times 10^{-4}$ to $2 \times 10^{-2}$ mbar. In steps 9 to 12 of growing the (Al,Ga)N layers the beam equivalent pressure of elemental gallium is preferably at least $1 \times 10^{-8}$ mbar, and particularly preferably is within the range $1 \times 10^{-8}$ to $1 \times 10^{-4}$ mbar. For a step in which aluminium is supplied, the beam equivalent pressure of aluminium is preferably at least $1 \times 10^{-8}$ mbar, is more preferably within the range $1 \times 10^{-8}$ to $1 \times 10^{-4}$ mbar, and is particularly preferably within the range from $1 \times 10^{-8}$ to $2 \times 10^{-7}$ mbar.

The growth rate of an (Al,Ga)N layer is determined primarily by the b.e.p. of gallium. The values for the b.e.p. of gallium given above give acceptable growth rates. In particular, use of a b.e.p. of gallium lower than $1 \times 10^{-8}$ mbar may not provide an acceptable growth rate or good material quality.

For a given gallium b.e.p., the b.e.p. of aluminium determines the aluminium concentration of the (Al,Ga)N layer.

For a given gallium b.e.p., and (in the case of an AlGaN layer) for a given aluminium b.e.p., the ammonia b.e.p determines the V/III ratio. As noted hereinabove, the V/III ratio should be kept high to ensure good material quality. When an (Al,Ga)N layer having a desired aluminium concentration is to be grown at a desired growth rate, it will not be possible to vary the b.e.p. of gallium or the b.e.p. of aluminium significantly, since these are largely determined by the growth rate and the desired aluminium concentration. Thus, the b.e.p of ammonia is adjusted to maintain a high V/III ratio.

The supply rates of the components should not be so high that the gas pressure in the growth chamber becomes too high for MBE growth.

In the embodiment described above the (Al,Ga)N layers were not intentionally doped. If a particular (Al,Ga)N layer is desired to be intentionally doped to provide the layer with extrinsic conductivity this may be done by supplying a suitable dopant to the reaction chamber during the growth of that layer. For example, if the first (Al,Ga)N layer 4 is desired to be an n-type doped layer, the supply of a suitable n-type dopant such as silicon to the growth chamber is started at time $t_1$ and is terminated at time $t_2$.

Figure 3:
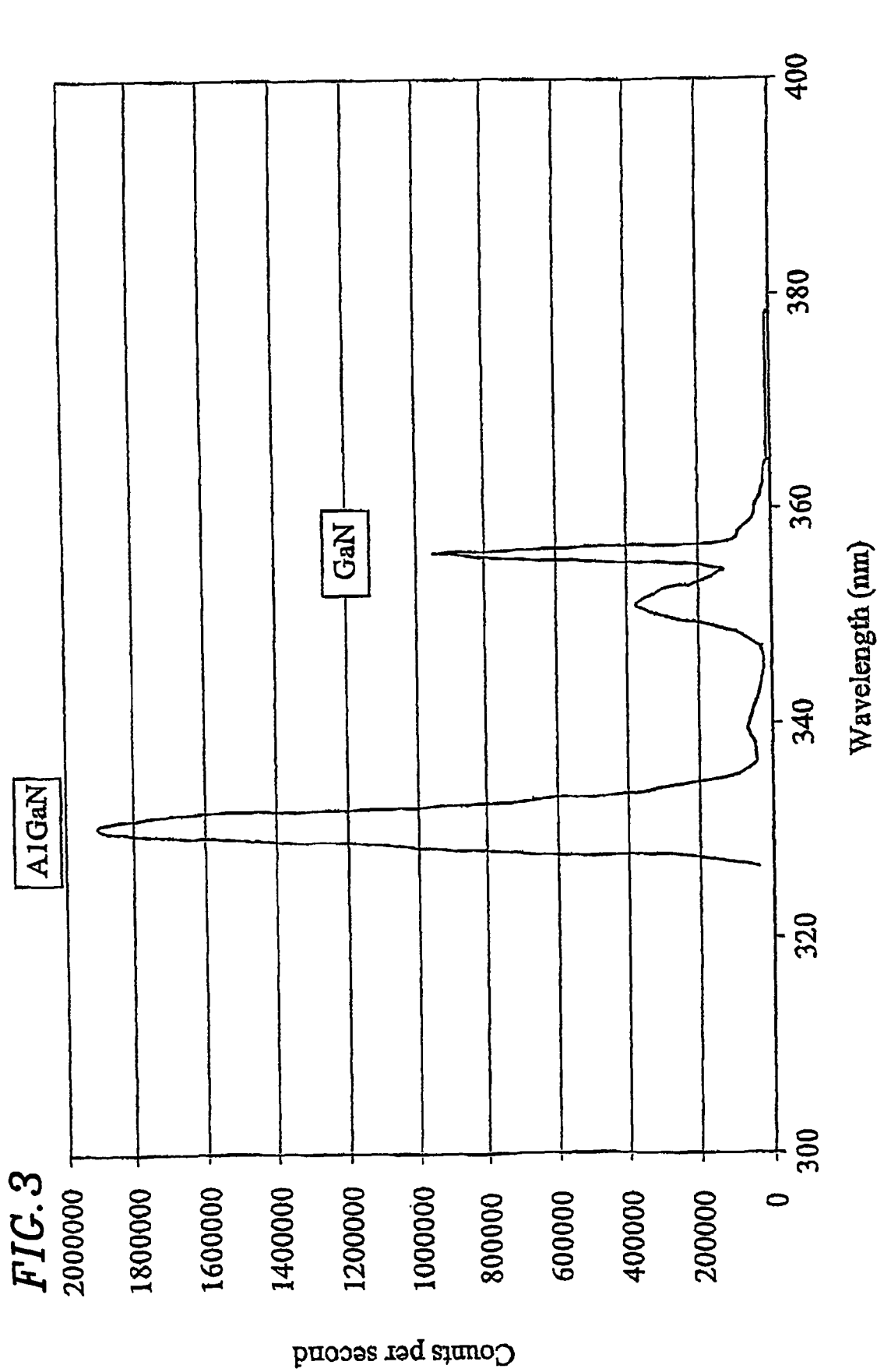
FIG. 3 illustrates the photo-luminescence spectrum for an AlGaN layer grown according to a method of the present invention.

FIG. 3 shows a photoluminescence spectrum taken at 10K of a 0.8 μm thick AlGaN layer grown on a GaN template substrate by a method according to the invention. The peak emission of AlGaN at 330.7 nm is prominent in the spectrum. The emission peak of GaN at 355.7 nm (from the substrate) is also clearly visible in the spectrum.

The invention has been described above with particular reference to growth of the multiplayer structure of FIG. 1, which contains four (Al,Ga)N layers. The invention is not limited to growth of such a structure, however, and may be applied to growth of structures having two or three (Al,Ga)N layers or having only one (Al,Ga)N layer. It may also be applied to growth of structures having more than four (Al,Ga)N layers.

Figure 4:
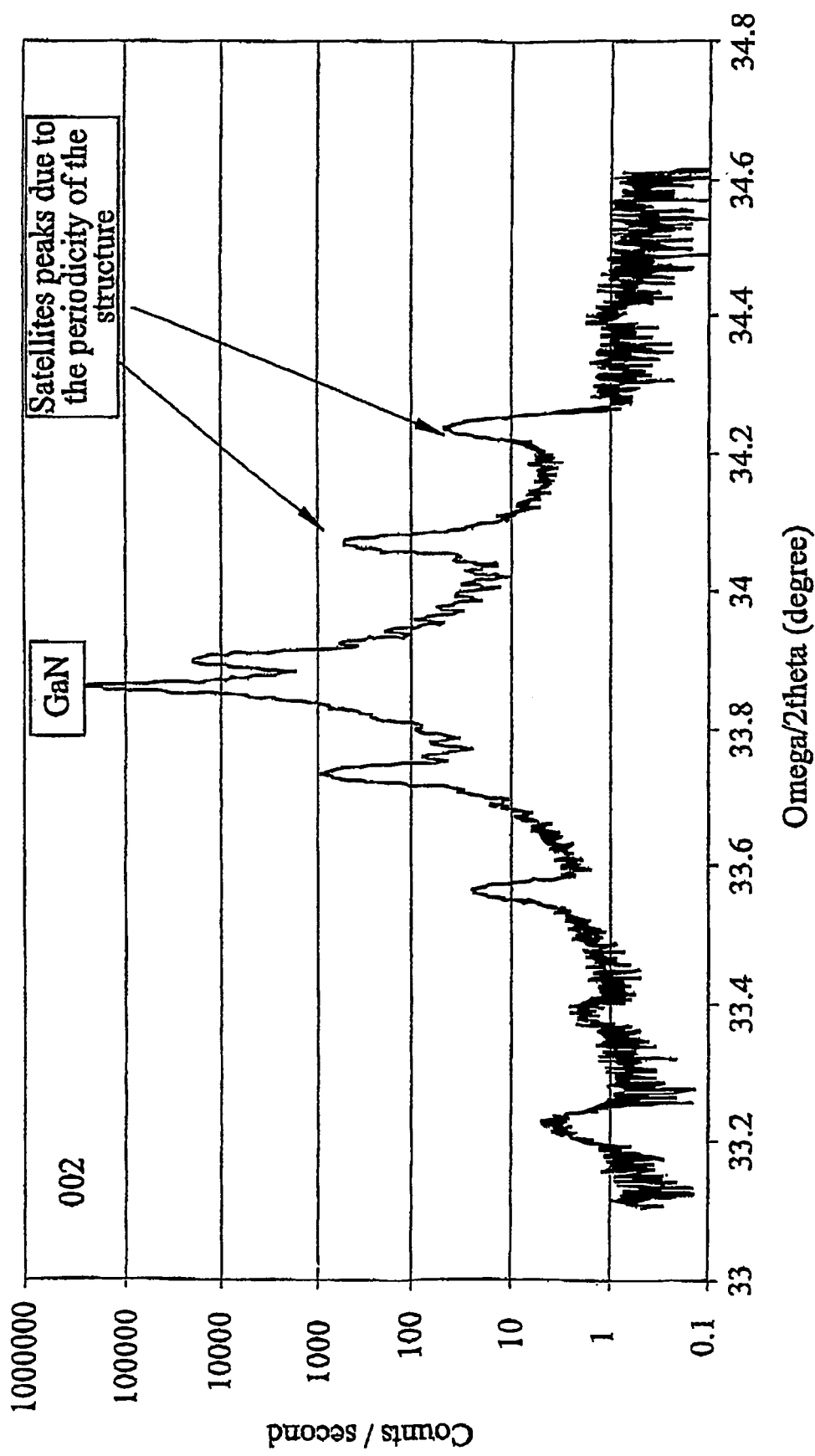
FIG. 4 illustrates the X-ray diffraction spectrum of an AlGaN/GaN semiconductor layer structure grown according to a method of the present invention.

FIG. 4 shows an (0002) X-ray diffraction spectrum of a 10 period (AlGaN/GaN) heterostructure grown by a method according to the invention. (A "10 period" heterostructure contains 10 AlGaN/GaN layer pairs.) The principal feature in the spectrum is the GaN peak. Intense satellite peaks are also present in the spectrum, and their presence is a signature of a good periodicity of the structure. The fine fringes which can be seen near the position of the GaN peak demonstrate the high crystalline quality of the whole structure.

The present invention requires a MBE growth apparatus that can achieve a V/III ratio of more than 10:1 during the growth process, and that can preferably achieve a V/III ratio of more than 500:1 during the growth process. The use of a high V/III ratio during the growth process of the present invention allows an (Al,Ga)N nitride semiconductor layer to be grown at temperatures well above those used in prior art MBE methods. This leads to improved material quality. The MBE growth process of the present invention requires at least one thousand times less ammonia gas than does a conventional MOVPE process.

Such high V/III ratios can be achieved, for example, in a MBE growth apparatus in which ammonia gas is introduced into the growth chamber through a conduit whose outlet end is placed as close to the substrate as possible without radiative heat from the substrate causing excessive local heating of the outlet of the supply conduit. The elemental gallium and elemental indium can be introduced into the growth chamber using a conventional effusion cell. Further effusion cells can be used to supply aluminium and/or an elemental dopant for incorporation into the epitaxial growth material as necessary.

Figure 5:
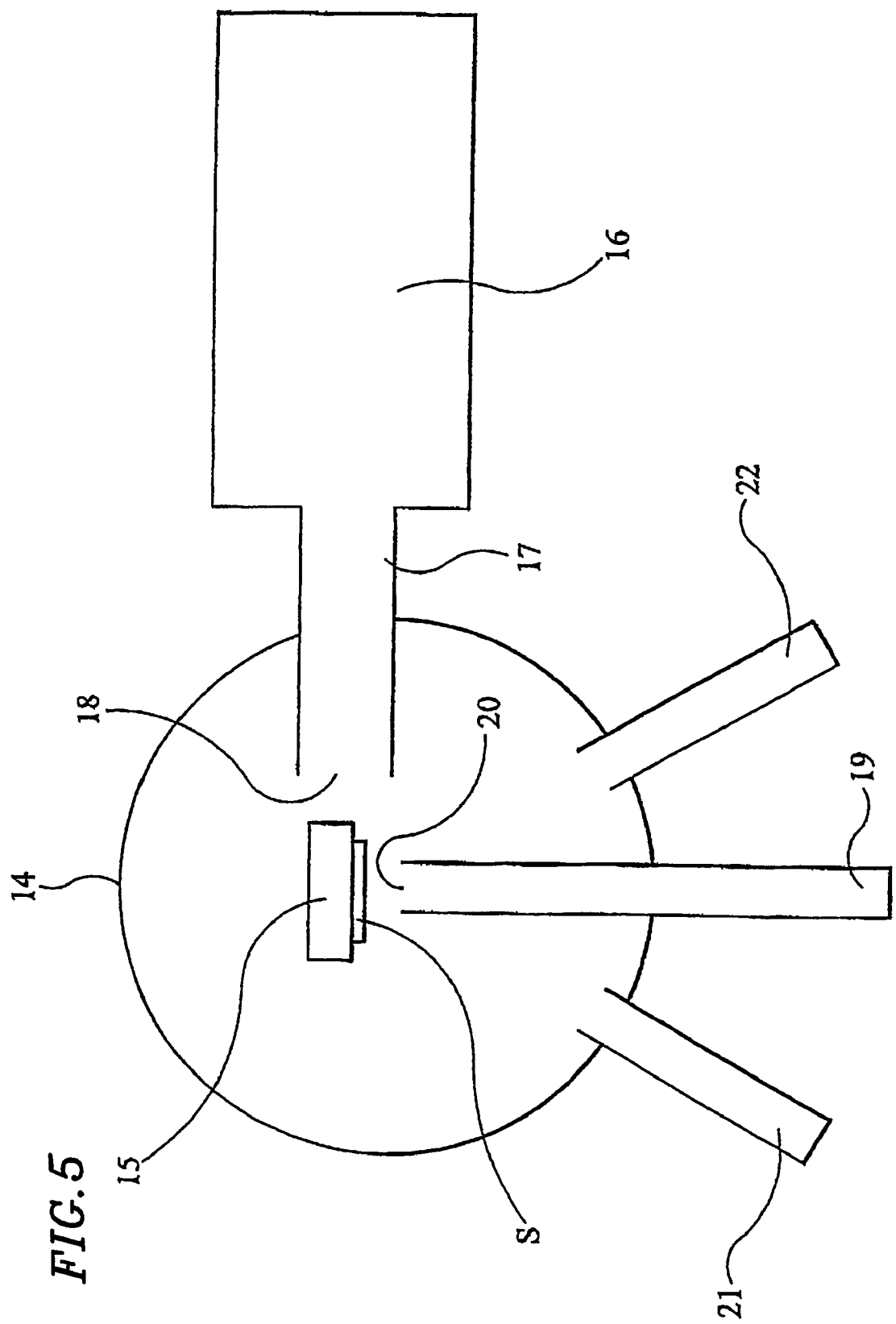
FIG. 5 is a schematic view of an MBE growth apparatus suitable for carrying out a method of the invention.

FIG. 5 is a schematic view of an apparatus suitable for the growth of a nitride semiconductor material by molecular beam epitaxy according to a method of the present invention. The apparatus comprises a growth chamber 14 in which is disposed a heated support 15 arranged to support and heat a substrate S. The growth chamber 14 is connected with an ultra-high vacuum pump 16 via an exhaust conduit 17 which extends into the growth chamber 14. The inner end of the exhaust conduit 17 defines a vacuum outlet 18 of the growth chamber 14. The vacuum outlet 18 is disposed adjacent to the substrate support 15.

The growth chamber 14 is further provided with a first supply conduit 19 which extends into the growth chamber so that an outlet 20 of the first supply conduit 19 is adjacent to and faces the surface of the substrate S upon which epitaxial growth is to take place. The first supply conduit 19 can be adjustably mounted relative to the chamber so that the relatively small distance between the outlet 20 of the first supply conduit 19 and the epitaxial growth surface of the substrate S can be varied during the epitaxial growth process. The longitudinal axis of the first supply conduit 19 is substantially perpendicular to the plane of epitaxial growth.

The first supply conduit 19 is used to supply ammonia which is the precursor of the nitrogen required in the epitaxial growth process. Because the outlet 20 of the first supply conduit 19 is positioned relatively close to the substrate S, a relatively high ammonia vapour pressure is localised at the surface of the epitaxially growing material while still enabling an ultra-high vacuum environment within the growth chamber 14 to be achieved by the pump 16. The high ammonia vapour pressure enables a high V/III ratio to be realised during the growth process.

The apparatus further comprises independently operable, shutter-controlled effusion cells 21, 22 (two such cells are shown in FIG. 5) which contain sources of elemental gallium and aluminium for the epitaxial growth process. The effusion cells 21 and 22 are conventionally positioned and define second and further supply conduits respectively. Additional effusion cells may be provided to supply, for example, dopant species during the growth process.

A MBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III ratio.

INDUSTRIAL APPLICABILITY

According to the present invention, high quality semiconductor layer structures comprising one or more $Al_xGa_{1-x}N$ ($0 \leq x \leq 1$) layers can be grown by molecular beam epitaxy (MBE). The present invention achieves improved material quality over conventional MBE growth methods and requires at least one thousand times less ammonia gas than a conventional metal-organic vapour phase epitaxy growth. These semiconductor layer structures are suitable for use in light-emitting diodes and laser diodes, for example. The growth of these layer structures is therefore of considerable commercial importance.

The invention claimed is:

1. A method of growing an AlGaN semiconductor layer structure, the method comprising the step of:
   (a) supplying ammonia, gallium and aluminum to a growth chamber thereby to grow a first (Al,Ga)N layer having a non-zero aluminum mole fraction by MBE over a substrate disposed in the growth chamber; wherein ammonia is supplied at a beam equivalent pressure of at least $1\times10^{-4}$ mbar, gallium is supplied at a beam equivalent pressure of at least $1\times10^{-8}$ mbar and aluminum is supplied at a beam equivalent pressure of at least $1\times10^{-8}$ mbar.

2. A method as claimed in claim 1 wherein ammonia is supplied at a beam equivalent pressure in the range from $1\times10^{-4}$ mbar to $2\times10^{-2}$ mbar.

3. A method as claimed in claim 1 wherein the substrate temperature is within the range from 850° C. to 1050° C.

4. A method as claimed in claim 1 wherein gallium is supplied at a beam equivalent pressure in the range from $1\times10^{-8}$ mbar to $1\times10^{-4}$ mbar.

5. A method as claimed in claim 1 wherein aluminum is supplied at a beam equivalent pressure in the range from $1\times10^{-8}$ mbar to $1\times10^{-4}$ mbar.

6. A method as claimed in claim 5 wherein aluminum is supplied at a beam equivalent pressure in the range from $1\times10^{-8}$ mbar to $2\times10^{-7}$ mbar.

7. A method as claimed in claim 1 and comprising the further step of:
   (b) varying the supply rate of gallium and/or aluminum thereby to grow a second (Al,Ga)N layer by MBE over the first (Al,Ga)N layer, the second (Al, Ga)N layer having a different aluminum mole fraction from the first (Al,Ga)N layer.

8. A method as claimed in claim 7 wherein step (b) comprises reducing the supply rate of aluminum to zero whereby the second (Al,Ga)N layer is a GaN layer.

9. A method as claimed in claim 1 and comprising the further step of:
   (c) varying the supply rate of gallium and/or aluminum thereby to grow a third (Al,Ga)N layer by MBE over the second (Al,Ga)N layer, the third (Al,Ga)N layer having a different aluminum mole fraction from the second (Al,Ga)N layer.

10. A method as claimed in claim 9 wherein the third (Al,Ga)N layer has substantially the same aluminum mole fraction as the first (Al,Ga)N layer.

11. A method as claimed in claim 1 wherein the substrate comprises an (In,Ga)N layer.

12. A method as claimed in claim 11 wherein the substrate is an InGaN substrate.

13. A method as claimed in claim 11 wherein the substrate is a GaN substrate.

14. A method as claimed in claim 11 wherein the substrate comprises an (In,Ga)N epitaxial layer disposed over a base substrate.

15. A method as claimed in claim 1 and comprising the further step of supplying a dopant during at least step (a).

16. A method as claimed in claim 1 wherein the first (Al, Ga)N layer has an aluminum mole fraction of greater than 0.01.

17. A method as claimed in claim 1 wherein the first (Al, Ga)N layer has an aluminum mole fraction of less than 0.2.

18. An (Al,Ga)N layer grown by a method as defined in claim 1.

19. An (Al,Ga)N multilayer structure grown by a method as defined in claim 7.

20. An optoelectrome device comprising an (Al,Ga)N layer as defined in claim 18.

21. An optoelectronic device comprising an (Al,Ga)N multilayer structure as defined in claim 19.

* * * * *

UNITED STATES PATENT AND TRADEMARK OFFICE
CERTIFICATE OF CORRECTION

| | |
|---|---|
| PATENT NO. | : 7,504,321 B2 |
| APPLICATION NO. | : 10/525406 |
| DATED | : March 17, 2009 |
| INVENTOR(S) | : Valerie Bousquet et al. |

It is certified that error appears in the above-identified patent and that said Letters Patent is hereby corrected as shown below:

On the Title Page, Item (73) should read
-- (73)   Assignee:    Sharp Kabushiki Kaisha, Osaka-shi (JP) --.

Signed and Sealed this

Twenty-eighth Day of April, 2009

JOHN DOLL
*Acting Director of the United States Patent and Trademark Office*